United States Patent
Krenzke et al.

(10) Patent No.: US 7,200,066 B2
(45) Date of Patent: Apr. 3, 2007

(54) ACCURATE POWER SUPPLY SYSTEM FOR FLASH-MEMORY INCLUDING ON-CHIP SUPPLY VOLTAGE REGULATOR, REFERENCE VOLTAGE GENERATION, POWER-ON RESET, AND SUPPLY VOLTAGE MONITOR

(75) Inventors: Rainer Krenzke, Esslingen (DE); Cang Ji, Kirchheim/Teck (DE)

(73) Assignee: Dialog Semiconductor Manufacturing Ltd., Kirchheim/Teck-Nabern (DE)

( * ) Notice: Subject to any disclaimer, the term of this patent is extended or adjusted under 35 U.S.C. 154(b) by 18 days.

(21) Appl. No.: 11/191,831

(22) Filed: Jul. 28, 2005

(65) Prior Publication Data
US 2007/0014176 A1 Jan. 18, 2007

(30) Foreign Application Priority Data
Jul. 18, 2005 (EP) ................................ 05392011

(51) Int. Cl.
*G11C 5/14* (2006.01)
(52) U.S. Cl. .................................. 365/226; 365/189.09
(58) Field of Classification Search ................ 365/226, 365/189.09, 227
See application file for complete search history.

(56) References Cited

U.S. PATENT DOCUMENTS

| | | | |
|---|---|---|---|
| 5,444,412 A * | 8/1995 | Kowalski | 327/541 |
| 5,519,656 A * | 5/1996 | Maccarrone et al. | 365/189.09 |
| 6,307,802 B1 * | 10/2001 | Manning | 365/226 |
| 6,480,436 B2 * | 11/2002 | Confalonieri et al. | 365/226 |
| 6,535,424 B2 | 3/2003 | Le et al. | 365/185.18 |
| 6,738,298 B1 | 5/2004 | Cioaca et al. | 365/189.09 |
| 6,753,722 B1 | 6/2004 | Kondapalli et al. | 327/540 |
| 6,791,893 B2 | 9/2004 | Pekny et al. | 365/226 |

* cited by examiner

*Primary Examiner*—Anh Phung
(74) *Attorney, Agent, or Firm*—Saile Ackerman LLC; Stephen B. Ackerman

(57) ABSTRACT

The supply voltage of an on-chip flash memory is regulated with two feedback loops. One loop comprises the flash memory, a register, and a voltage regulator with bandgap reference to regulate the supply voltage. The other loop comprises the flash memory, another register, an amplifier with bandgap reference, and comparators to monitor the supply voltage and adjust the threshold of the signals which control the operation of the flash memory and registers. The calibration data controls variable resistive means in the feedback paths of the voltage regulator and in the calibration of the threshold values of the control signals. Calibration data is held in the registers when the supply voltage is out-of-range to prevent self-start up.

18 Claims, 3 Drawing Sheets

ACCURATE POWER SUPPLY SYSTEM FOR FLASH-MEMORY INCLUDING ON-CHIP SUPPLY VOLTAGE REGULATOR, REFERENCE VOLTAGE GENERATION, POWER-ON RESET, AND SUPPLY VOLTAGE MONITOR

BACKGROUND OF THE INVENTION

1. Field of the Invention

The invention relates to voltage regulation within an integrated circuit, and more particularly to the on-chip regulation of the supply voltage of a flash memory using a bandgap voltage reference and the use of calibration data in feedback loops.

2. Description of the Related Art

The problem of regulating the supply voltage for flash memory circuits is the supply range specification for read and write access operation is very small and therefore precise supply voltage regulation and voltage monitoring is required. All this is difficult to achieve in integrated circuits. This problem is further aggravated by the external power supply voltage generation and the external Reset and power-on-reset (POR) generation.

U.S. Patents of the related art that bear on the present invention are:

U.S. Pat. No. 6,791,893 (Pekny et al.) discloses the regulation of voltages in which includes providing a first voltage using a voltage regulator, determining that a second voltage level is desired and initializing the voltage regulator to provide the second voltage level.

U.S. Pat. No. 6,753,722 (Kondapalli et al.) teaches a method and apparatus where a voltage regulator receives a first reference voltage and provides a regulated voltage. A comparator compares a second reference voltage with the regulated voltage. Its output signals if the difference between the input signals is greater than its offset voltage. A voltage clamp then clamps the regulated voltage to the second reference voltage.

U.S. Pat. No. 6,738,298 (Cioaca et al.) describes a reference voltage adjustment circuit where a decoder is coupled to a counter circuit. The decoder generates a resistance selection signal that creates a resistance value. This resistance value is coupled to a reference voltage circuit which in turn generates an updated reference voltage.

U.S. Pat. No. 6,535,424 (Le et al.) presents the application of a voltage detection circuit which is used to measure the $V_{CC}$ applied to a voltage boost circuit which generates a boosted word line voltage for the read mode. By compensating for the variations in the $V_{CC}$ supply applied to the voltage boost circuit, the boost voltage is regulated.

One solution is to use feedback loops to force a tighter control over the VDD supply voltage and POR generation upon which the Read/Write flash memory control depends. However, since systems with several feedback loops are problematic to control, a new approach is required for generating a precise supply voltage and the associated voltage monitoring. With on-chip voltage supply regulation there is needed a calibration of the voltage regulator for accurate $V_{DD}$-level generation. Another requirement is that the calibration value needs to be stored within the flash memory. For signaling when the flash memory operates outside of its voltage supply range and to inhibit flash memory access, accurate Power-On-Reset (POR) and $V_{DD}$ monitoring are necessary. The on-chip POR/VDD monitoring circuit also needs accurate threshold level generation through calibration and the storing of the calibration value within the flash memory. The present invention detailed below; solves the above mentioned problems and satisfies the requirements discussed above, in particular system stability.

SUMMARY OF THE INVENTION

It is an object of at least one embodiment of the present invention to provide a system and a method which generates a very precise supply voltage and a voltage monitoring signal for an on-chip flash memory.

It is another object of the present invention to insure that in case of an out-of-range supply voltage the access to the flash memory is blocked.

It is yet another object of the present invention to ensure accurate threshold level generation for the power-on-reset signal and the Supply Voltage Monitor signal.

It is still another object of the present invention to prevent or reduce self-power-up sequencing and instability of the system in the event of a power failure.

It is a further object of the present invention is to ensure a quick return to steady state in case of a supply voltage spike.

These and many other objects have been achieved by creating two feedback loops around the flash memory which regulate the supply voltage of the flash memory and generate precise threshold voltages for the flash memory Read/Write Control. The first feedback loop comprises the flash memory, a first register, and a voltage regulator for regulating the supply voltage. Calibration data from the flash memory is loaded into the first register and communicated to a first input of the voltage regulator. A comparison with a second input which is coupled to a bandgap reference produces a regulated supply voltage at the output. The data bus from the first register controls a variable resistive means which is in the feedback path from the first register to the first input of the voltage regulator.

To set precise voltage thresholds for the flash memory Read/Write Control and power-on-reset (POR), a second feedback loop is used which takes calibration data together with the bandgap reference and the supply voltage to generate a calibrated supply voltage signal which activates the Read/Write Control of the flash memory as well as the Set/Hold control of the calibration registers. This second feedback loop comprises the flash memory, a second register, a bandgap based amplifier, a comparator, and a digital block. Calibration data from the flash memory is loaded into the second register and communicated to a first input of the amplifier. The second input is the bandgap reference. The data bus from the second register controls a variable resistive means which is in the feedback path from the second register to the first input of the amplifier. The output of the amplifier feeds one input of a comparator while the supply voltage, via an attenuator, feeds the other input. The threshold of the output of this comparator is the Supply Voltage Flag and is thus adjusted as a function of not only the variable resistance feedback of the amplifier but also of variations in the supply voltage. The Supply Voltage Flag along with the POR signal is an input to the Digital Block. The POR signal is generated by a comparator which is fed by the bandgap reference and a suitably attenuated supply voltage. The threshold of POR is also adjusted as a function of the supply voltage The Digital Block comprises logic and a state machine and generates the Read/Write Control for the flash memory and the Enable (set) signal for the calibration registers.

Thus, the second feedback loop determines that the supply voltage is within the nominal supply voltage range of the flash memory regarding read and write access operation, while the updating (trimming) of the calibration data in the registers, when the supply voltage is within its nominal range, serves to maintain a narrow supply voltage range.

In the preferred embodiment of the present invention the state machine has four states. In state 1 POR is active as long as the supply voltage is less than 2.4 V. In state 2 the supply voltage is larger than 2.4 V but smaller than 2.7 V; the registers get enabled and receive calibration data from flash memory because the Read Control is active—write access, though, is blocked. In state 3 the supply voltage is larger than 2.7 V. The Read/Write Control now becomes fully active also for flash memory write access. The register Enable signal gets deactivated and therefore the registers hold their data now. The difference in the handling of the Read/Write Control between states 3 and 4 is due to fact that flash memory supply voltage specifications usually have tighter upper and lower voltage limits for write access than for read access. If there is a short term voltage dip below 2.7 V, state 4 is entered and the Write Control is deactivated, only read access is possible. If the voltage dip does not go to 2.4 V but goes back to above 2.7 V, state 3 is entered again. The holding of the data in the registers ensures that the system does not go into a self-power-up and is of great importance to the stability of the system. More details regarding the state machine will be found in the Description of the Preferred Embodiment below. Note that the voltage thresholds given above are not meant to be mathematically precise but are meant to illustrate the boundaries between the states. It is obvious to those skilled in the art that the voltages given above are by way of example and that other boundaries and voltage values may be selected according to the specific application and that the values chosen here are no way meant to limit the scope of the invention.

These and many other objects and advantages of the present invention will be readily apparent to one skilled in the art to which the invention pertains from a perusal of the claims, the appended drawings, and the following detailed description of the preferred embodiment.

DESCRIPTION OF THE PREFERRED EMBODIMENT

The main points of the present invention are that two comparators are used, one for Power-On-Reset (POR) and another for monitoring of the VDD voltage. During the power-up phase an uncalibrated bandgap-based POR is used. After power-up, during further operation, a calibrated VDD-voltage monitor is used for power-fail detection. The signals of these two comparators, POR and VDD-Flag, are combined via a digital logic block to prevent access to the flash memory (read/write) when the supply voltage VDD is out of range and to generate an Enable signal for the calibration data holding registers. These registers, which hold the calibration data as read out from the flash memory and which are part of the feedback loop from the flash memory to the Voltage Regulator and the VDD/POR Monitor, respectively, do not receive a reset signal to prevent resetting of those most recently sent calibration data in the event of a power failure and are only controlled by the Enable signal. This is because a reset would result in an unwanted self-power-up which most likely would cause an unstable operation. This will be explained in greater detail below.

Figure 1:
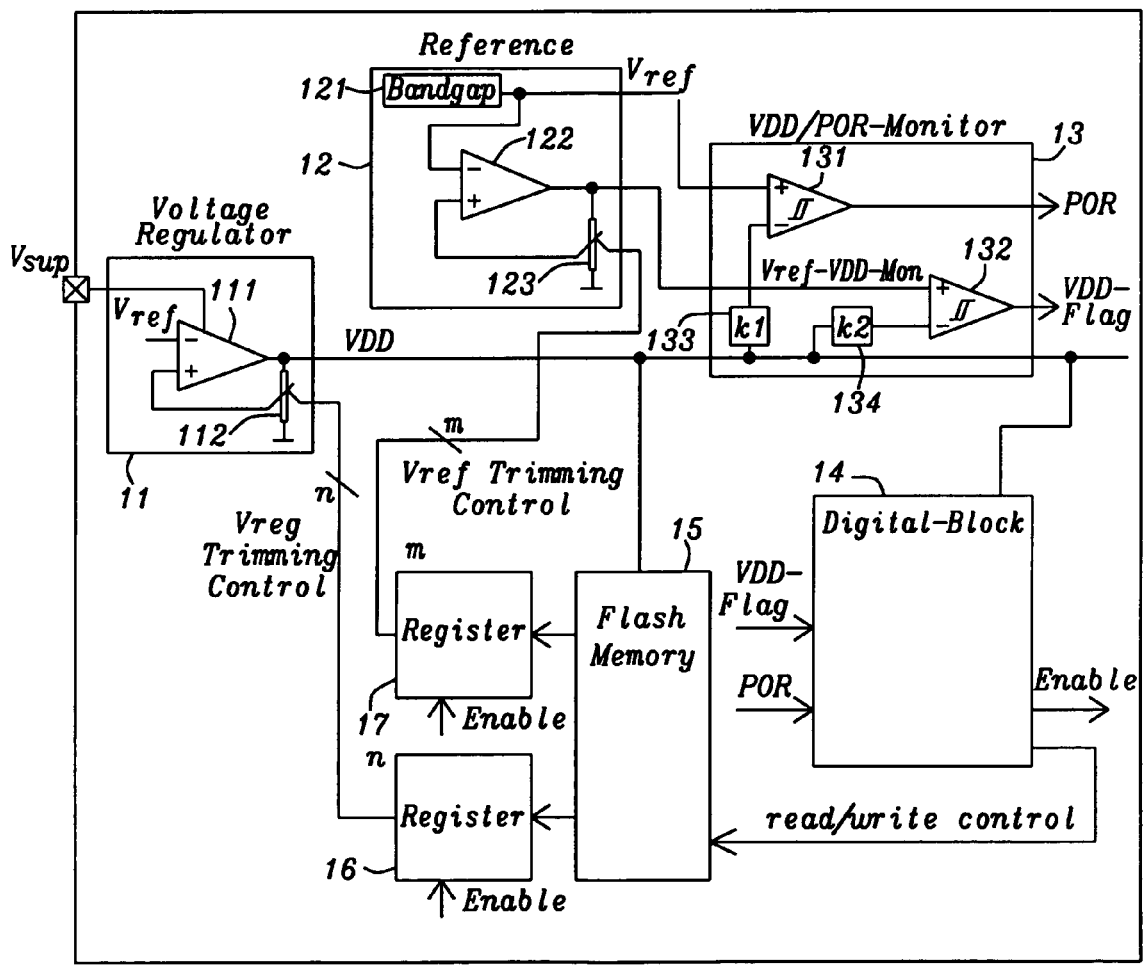
FIG. 1 is a schematic diagram of the present invention.

A preferred embodiment of the present invention of the Accurate Power Supply System For Flash-Memory 10, is shown in FIG. 1. Circuit 10 comprises Voltage Regulator 11, Reference 12, VDD/POR-Monitor 13, Digital Block 14, Flash Memory (FM) 15, and Registers 16 and 17. These components are described in more detail next:

Voltage Regulator 11 comprises an amplifier 111 (a comparator may also be used) which receives the unregulated voltage Vsup and the reference voltage Vref at its minus input and has as output the regulated supply voltage VDD. VDD is fed back to the plus input via a variable resistive means 112.

Reference 12 contains bandgap reference 121 with output Vref of typically 1.25 Volt, which feeds the minus input of comparator 122. The output of comparator 122, Vref-VDD-Mon is fed back to the plus input via a variable resistive means 123.

VDD/POR-Monitor 13 contains comparators 131 and 132 and gain blocks 132 and 134. The plus input of comparator 131 goes to output Vref, the minus input is coupled via gain block 133 to VDD, and the output is Power-on-Reset (POR). Comparator 131 has a hysteresis response as indicated by the symbol within. The plus input of comparator 132 goes to output Vref-VDD-Mon, the minus input is coupled via gain block 134 to VDD, and the output is VDD-Flag. Gain blocks 133 and 134 have gain factors k1 and k2, respectively, which are both less than 1.

Digital Block 14 receives supply voltage VDD and is a 4-state machine with inputs POR, VDD-Flag and outputs Enable and Read/Write Control.

Flash Memory 15 receives supply voltage VDD and has input Read/Write Control (other inputs such as the data bus are not shown here since they have no bearing on the present invention).

Register 16 is n bits wide and receives its input from Flash Memory 15. The output bus VregTrimmingControl of Register 16 is also n bits wide and provides the trimming control for variable resistive means 112. Latches instead of a register may also be used.

Register 17 is m bits wide and receives its input from Flash Memory 15. The output bus VrefTrimmingControl of Register 17 is also m bits wide and provides the trimming control for variable resistive means 123. Latches instead of a register may also be used.

There are two feedback circuits, the first one comprises blocks 15, 16, 11, and VDD, the second one comprises blocks 15, 17, 12, 13, and 14.

The function of blocks 12 and 13 is to produce:

a) the POR signal when VDD is less than 2.4 V (this is the value chosen in the preferred embodiment of the present invention, clearly other values can be selected based on the individual application). This is done by comparing Vref against a fractional voltage level derived from VDD, and b) the signal VDD-Flag when VDD is greater than 2.4 V and less than 2.7 V (again, 2.7 V is the value chosen in the preferred embodiment of the present invention, clearly other values can be selected based on the individual application). Signal Vref-VDD-Mon is applied to the positive input of comparator 132 and a fractional voltage level derived from VDD is applied to its negative input. Signal Vref-VDD-Mon in turn is generated by comparator 122 by comparing Vref against a voltage derived from a variable resistive means 123 which in turn is controlled by the data stored in Register 17. The feedback path from Register 17 to resistive means 123, comparator 122 to comparator 132 allows the signal VDD-Flag to be adjusted around the nominal value of 2.7 V according to the actual VDD value within Flash Memory 15. This arrangement is thus able to compensate for voltage drops that occur dynamically along the VDD supply path to the Flash Memory circuits and to guarantee that Flash Memory 15 always is supplied with a supply voltage of at least 2.7 V. Digital Block 14 in the preferred embodiment of the present invention is a 4-state machine receiving signals POR and VDD-Flag. The outputs are signals Enable and Read/Write Control. POR is defined as high ("1") when active (since the negative input to Comparator 131 is in communication with VDD), that is POR=1 flags a low VDD. When VDD is larger than 2.4 V then POR=0. Signal VDD-Flag is also defined as high when active.

State 1 is during POR=1. Then the Read/Write Control to the Flash Memory is blocked, i.e., =0. As VDD increases and becomes larger than 2.4 V, POR switches from 1 to 0 and State 2 is reached.

In State 2 the Read/Write Control allows reading of the Flash Memory. The calibration data are read out and set into Registers 16 and 17 since Enable is active ("1"). As VDD continues to rise and reaches 2.7 V, State 3 is entered.

In State 3 the VDD-Flag is now turned inactive ("0"). The Enable signal to Registers 16 and 17 gets deactivated ("0"=Hold) which means Registers 16 and 17 hold the calibration data from State 2. The "Read/Write Control" becomes fully active, that is read and write actions to the memory can proceed thereby allowing further re-calibration.

State 4 will be entered if there is a dip in VDD which bring VDD lower than 2.7 V. This will activate the VDD-Flag because the VDD-Flag threshold is higher (2.7 V) than the POR threshold (2.4 V). In State 4 the Read/Write Control is blocked for write operations. Registers 16 and 17 keep their calibration data because Enable is still OFF ("0"=Hold).

If VDD rises back above the VDD-Flag threshold the State 3 is again entered. If, however, VDD has fallen further in value to below the POR threshold, then the system moves to State 1.

The key point is that the registers never get reset when the system is in State 4 because VDD is still sufficiently high (between 2.4 and 2.7 V) to keep the latches "alive", meaning that the registers can keep their values. This makes the system more stable because the calibration data for Voltage Regulator 11 is kept. Otherwise, if the registers would also see a reset, the following scenario would happen:

in the intermediate VDD range, where VDD falls slightly below the VDD-Flag threshold but keeps above the POR threshold, all registers get reset and therefore Voltage Regulator 11 receives the un-trimmed default setting and produces an increased VDD output. Therefore the VDD-Flag gets released, i.e., forced to "0", and the system reads in from Flash Memory 15 the calibration data. Now the regulator produces a lower VDD output based on the new calibration data and the VDD-Flag goes active again, and so on.

This scenario would happen only under the assumption that the un-trimmed (default) regulator setting produces a higher VDD output than the un-trimmed default setting. In most cases this will be actually true due to special constrains on the startup-behavior of the regulator.

The State Table below lists the four states and the associated level of the signals entering and leaving Digital Block 14.

State Table:

| VDD | State | POR | VDD-Flag | Read/Write Control | Enable |
|---|---|---|---|---|---|
| VDD < 2.4 V | 1 | 1 | 1 | read/write access blocked. | 0 = hold reg. |
| 2.4 < VDD < 2.7 V | 2 | 0 | 1 | write access blocked | 1 = set reg. |
| VDD > 2.7 V | 3 | 0 | 0 | read/write access enabled | 0 = hold reg. |
| VDD dips < 2.7 V | 4 | 0 | 1 | write access blocked | 0 = hold reg. |
| VDD rises > 2.7 V | 4 → 3 | | | | |
| VDD falls < 2.4 V | 4 → 1 | | | | |

Figure 2:
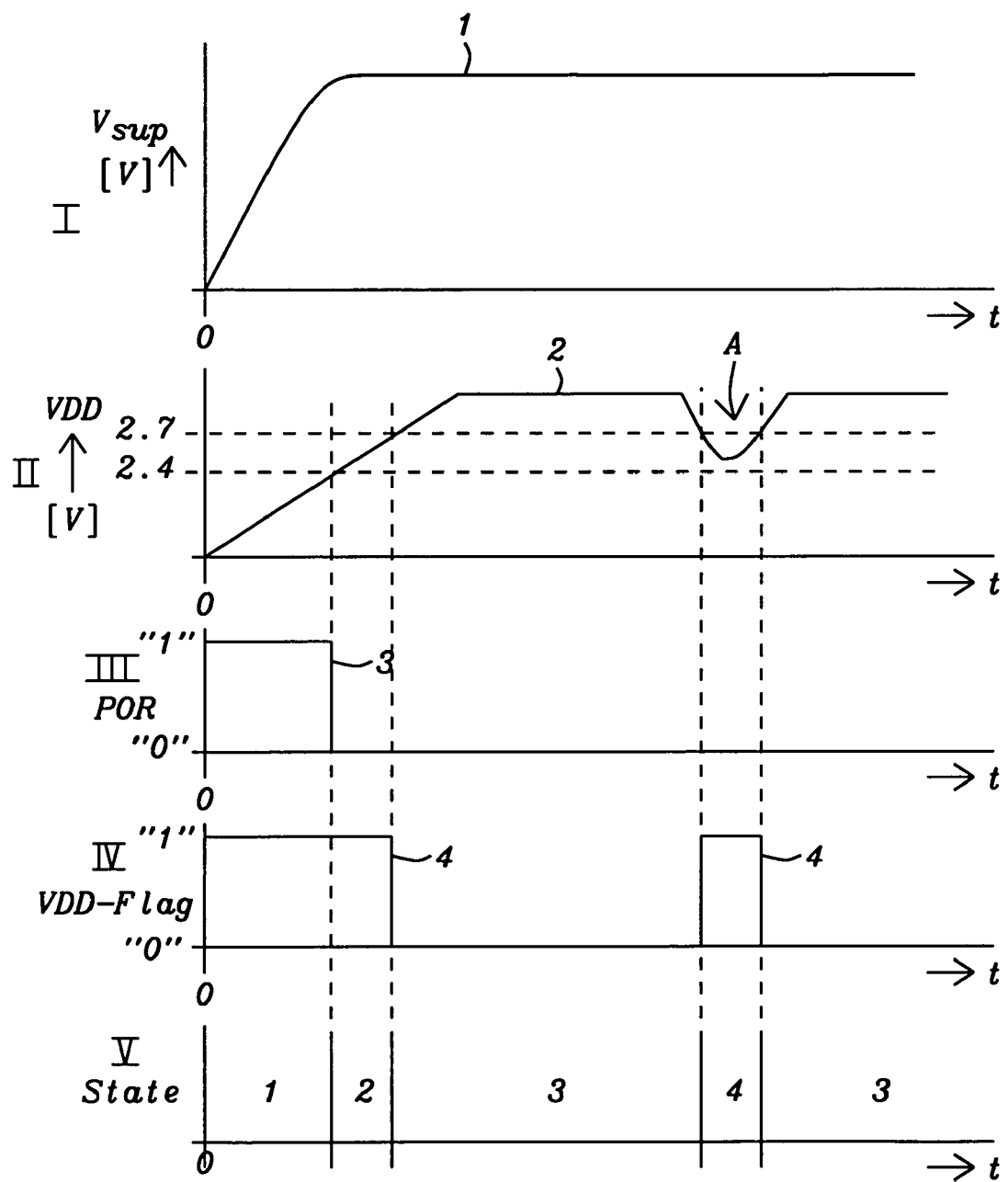
FIG. 2 are graphs of input/output signals of a Digital Block which controls the flash memory.

Graphs of the input and output signals of Digital Block 14 are shown in FIG. 2.

All graphs numbered I to V show time on the horizontal axis.

Curve 1 of graph I shows Vsup, the input to voltage regulator 11 on the vertical axis.

Curve 2 of graph II shows supply voltage VDD on the vertical axis (not to scale). A dip in Curve 2, identified by Arrow A, indicates a temporary drop in VDD but not reaching 2.4 V.

Curve 3 of graph III shows that the power-on-reset signal (POR) is active ("1") from time 0 on, but is reset when VDD reaches 2.4 V.

Curve 4 of graph IV shows the VDD-Flag. It is active ("1") from time 0 to when VDD equals 2.7 V and is then reset. It is active again during the dip in VDD (Arrow A).

Curve 5 of graph V shows the state of the state machine as identified by the corresponding numerals.

Figure 3:
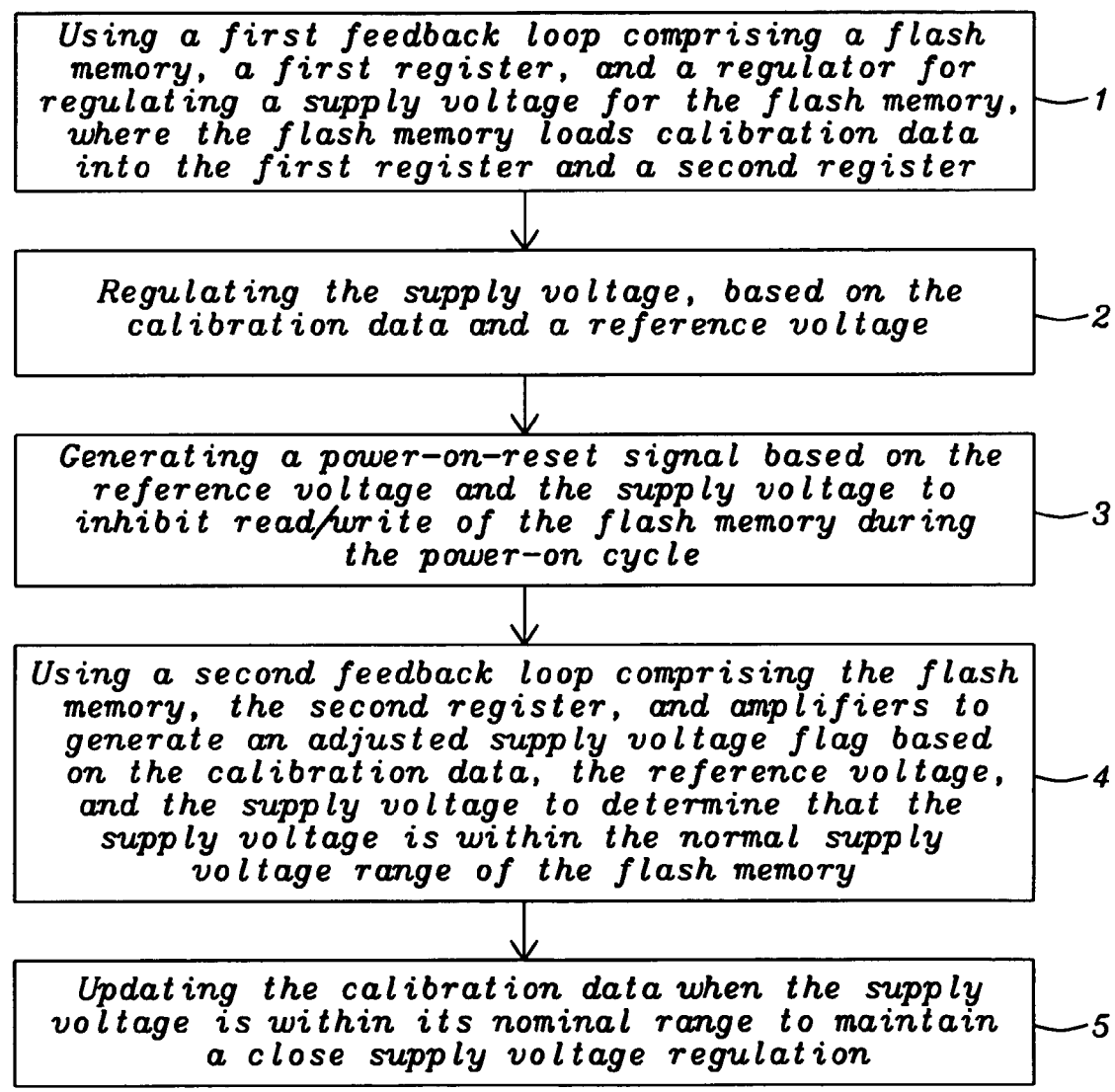
FIG. 3 is a block diagram illustrating the method of the present invention.

With reference to FIG. 3, we now describe a method of providing on-chip voltage supply regulation to maintain a constant supply voltage for a flash memory:

Block 1 uses a first feedback loop comprising a flash memory, a first register, and a regulator for regulating a supply voltage for the flash memory, where the flash memory loads calibration data into the first register and a second register, Block 2 regulates the supply voltage, based on the calibration data and a reference voltage, Block 3 generates a power-on-reset signal based on the reference voltage and the supply voltage to inhibit read/write of the flash memory during the power-on cycle, Block 4 uses a second feedback loop comprising the flash memory, the second register, and amplifiers to generate an adjusted supply voltage flag based on the calibration data, the reference voltage, and the supply voltage to determine that the supply voltage is within the nominal supply voltage range of the flash memory, and Block 5 updates the calibration data when the supply voltage is within its nominal range to maintain a close supply voltage regulation.

In summary, the advantages of the present invention are:
On-chip supply voltage regulation for the flash memory,
Calibration of the regulator for accurate supply voltage generation,
Accurate threshold level generation for power-on-reset and supply voltage monitoring,
Inhibit flash memory access (Read/Write) when the supply voltage its out-of-range,
Holding of the calibration data in the registers when the supply voltage is out-of-range for operation of the flash memory,
Feedback loops of the calibration data from the flash memory to the voltage regulator and the supply voltage monitor,
Registers are not reset on a supply voltage collapse to avoid self-power-up.

While the invention has been particularly shown and described with reference to the preferred embodiments thereof, it will be understood by those skilled in the art that various changes in form and details may be made without departing from the spirit and scope of the invention.

What is claimed is:

1. A power supply system for memory means, comprising:
a memory means for reading and writing data coupled to a regulated supply voltage;
voltage calibration signals read out from said memory means and coupled to a voltage regulator and an amplifier means;
said voltage regulator receiving an unregulated supply voltage, a bandgap reference voltage and said voltage calibration signals and generating at its output a regulated supply voltage which is adjusted by a first feedback loop which includes said memory means, said voltage calibration signals, and said regulated supply voltage;
a power-on-reset signal generated from said bandgap reference voltage and said regulated supply voltage to inhibit read/write operations to said memory means during power-up;
a supply voltage flag generated from said bandgap reference voltage, said voltage calibration signals, and said regulated supply, said supply voltage flag enabling read/write operations for said memory means, where said supply voltage flag is adjusted by a second feedback loop including said memory means, said voltage calibration signals, and said regulated supply voltage.

2. The power supply system of claim 1, wherein registers holding said voltage calibration signals hold their value during power-up and to avoid a self-power-up cycle when said supply voltage dips below a nominal supply voltage range.

3. The power supply system of claim 1, wherein registers holding said voltage calibration signals have their data updated from said memory means when said supply voltage is within a nominal supply voltage range.

4. The power supply system of claim 1, wherein said calibration feedback loops comprise a first and a second set of data bits, said first set controlling said voltage regulator, and said second set controlling said supply voltage flag, respectively.

5. The power supply system of claim 1, wherein regulation of said supply voltage is an on-chip supply voltage regulation for a flash memory.

6. The power supply system of claim 1, wherein said supply voltage flag provides calibrated supply voltage monitoring and power-fail detection.

7. A power supply system for a flash memory, comprising:
a reference circuit comprising a bandgap circuit and a first amplifier means with a first and a second input, said bandgap circuit generating a bandgap reference voltage, said first input of said first amplifier means coupled to said bandgap circuit, said first amplifier means generating a calibrated supply voltage monitor signal;
a voltage supply/power-on-reset monitor generating a power-on-reset signal and a supply voltage flag, where said power-on-reset signal is generated from said bandgap reference voltage and a regulated supply voltage, and where said supply-voltage flag is generated by said calibrated supply voltage monitor signal and said regulated supply voltage, said supply-voltage flag determining the low limit of the nominal supply voltage range;
digital logic means for combining said power-on-reset signal and said supply-voltage flag to generate read/write controls and an enable signal for first and second resistive means;
said flash memory coupled to said regulated supply voltage and receiving said read/write controls, said flash memory held inactive during the low limit of the nominal supply voltage range and executing read/write commands when said read/write controls are active;
said first register means receiving a first set of calibration data from said flash memory for providing feedback information to a voltage regulator;
said second register means receiving a second set of calibration data from said flash memory for providing feedback information to said second input of said first amplifier means; and
said voltage regulator comprising a second amplifier means with a first, a second, and a third input, for receiving an unregulated supply voltage, a reference voltage, and said first set of calibration data, respectively, where said voltage regulator generates at its output said regulated supply voltage for said flash memory.

8. The power supply system of claim 7, wherein registers holding said voltage calibration data hold their value during power-up and to avoid a self-power-up cycle when said supply voltage dips below a nominal supply voltage range.

9. The power supply system of claim 7, wherein registers holding said voltage calibration data have said calibration data updated from said memory means when said supply voltage is within a nominal supply voltage range.

10. The power supply system of claim 7, wherein said calibration feedback loops comprise a first and a second set of data bits, said first set controlling said voltage regulator, and said second set controlling said supply voltage flag, respectively.

11. The power supply system of claim 7, wherein comparators generate said power-on-reset signal and supply-voltage flag.

12. The power supply system of claim 7, wherein said supply voltage flag provides calibrated supply voltage monitoring and power-fail detection.

13. The method of providing on-chip voltage supply regulation to maintain a constant supply voltage, comprising the steps of:

a) using a first feedback loop comprising a memory means, register means, and regulator means for regulating a supply voltage for said memory means, where said memory means loads calibration data into said register means;

b) regulating said supply voltage, based on said calibration data and a reference voltage;

c) generating a power-on-reset signal based on said reference voltage and said supply voltage to inhibit read/write of said memory means during the power-on cycle;

d) using a second feedback loop comprising said memory means, said register means, and amplifier means to generate an adjusted supply voltage flag based on said calibration data, said reference voltage, and said supply voltage to determine that said supply voltage is within the nominal supply voltage range of said memory means; and e) updating said calibration data when said supply voltage is within its nominal range to maintain a close voltage regulation.

14. The method of claim 13, wherein when said supply voltage is within the operating range of said memory means read/write operations are enabled.

15. The method of claim 13, wherein said calibration data are held when said supply voltage is outside its nominal range.

16. The method of claim 13, wherein said calibration data is held in said register means when there is an intermittent voltage dip in said supply voltage to prevent a power-on cycle sequence.

17. The method of claim 13, wherein said supply voltage flag when active enables read/write operations of said memory means.

18. The method of claim 13, wherein said supply voltage flag provides calibrated supply voltage monitoring and power-fail detection.

* * * * *

UNITED STATES PATENT AND TRADEMARK OFFICE
CERTIFICATE OF CORRECTION

PATENT NO. : 7,200,066 B2
APPLICATION NO. : 11/191831
DATED : April 3, 2007
INVENTOR(S) : Rainer Krenzke and Cang Ji It is certified that error appears in the above-identified patent and that said Letters Patent is hereby corrected as shown below:

Title Page, Assignees, (73), delete Assignee, "Dialog Semiconductor Manufacturing Ltd, Kirchhein/Teck-Nabern (DE)" and replace with -- Dialog Semiconductor GmbH, Kirchheim/Teck-Nabern (DE) --.

Signed and Sealed this

Thirtieth Day of March, 2010

David J. Kappos
*Director of the United States Patent and Trademark Office*